(12) United States Patent
Kim et al.

(10) Patent No.: US 8,587,375 B2
(45) Date of Patent: Nov. 19, 2013

(54) POWER AMPLIFIER LINEARIZATION METHOD AND APPARATUS

(75) Inventors: Bum Man Kim, Pohang-si (KR); Jung Hwan Moon, Pohang-si (KR)

(73) Assignee: Postech Academy-Industry Foundation, Pohang-Si, Gyeongsangbuk-Do (KR)

( * ) Notice: Subject to any disclaimer, the term of this patent is extended or adjusted under 35 U.S.C. 154(b) by 136 days.

(21) Appl. No.: 13/270,552

(22) Filed: Oct. 11, 2011

(65) Prior Publication Data

US 2012/0086507 A1 Apr. 12, 2012

(30) Foreign Application Priority Data

Oct. 12, 2010 (KR) ........................ 10-2010-0099301

(51) Int. Cl.
*H03F 3/68* (2006.01)
(52) U.S. Cl.
USPC ........................ 330/124 R; 330/295; 330/149

(58) Field of Classification Search
USPC ...................................... 330/124 R, 149, 295
See application file for complete search history.

(56) References Cited

FOREIGN PATENT DOCUMENTS

| JP | 2003-92518 | 3/2003 |
|---|---|---|
| JP | 2006-165856 | 6/2006 |
| KR | 10-2009-0026097 A | 3/2009 |

*Primary Examiner* — Patricia Nguyen
(74) *Attorney, Agent, or Firm* — Kile Park Reed & Houtteman PLLC

(57) ABSTRACT

Disclosed is a method and apparatus for linearizing a power amplifier using a digital signal process (DSP), and particularly, is a method and apparatus for effectively linearizing an amplifier which has a plurality of distortion generating sources. To this end, there is a plurality of compensation methods and compensation units which can generate inverse distortion signals corresponding to the distortion components outputted by the plurality of distortion generating sources, thereby making it possible to provide superior linearity.

18 Claims, 9 Drawing Sheets

POWER AMPLIFIER LINEARIZATION METHOD AND APPARATUS

BACKGROUND OF THE INVENTION

1. Field of the Invention

The present invention relates to a power amplifier linearization method and apparatus, and more particularly, to a method and apparatus for effectively linearizing a power amplifier having a plurality of distortion generating sources.

2. Description of the Related Art

Recently, a power amplifier in a mobile communication system has been required to amplify a signal with high efficiency and high linear characteristics. In addition, a next generation mobile communication system uses a complicated modulation scheme in order to transmit a large amount of data to the user in a short time.

Accordingly, the peak-to-average power ratio (PAPR) of the signal increases. Generally, in order to provide linear amplification, a power amplifier operates at a back off point equal to or greater than the peak-to-average power ratio of a signal.

However, at this point, the power amplifier exhibits a considerably low efficiency characteristic. This is because the stable operation of a transmitter is not ensured due to an increase of the heating value of the transmitter. Therefore, an additional cooling system is required.

In order to improve the efficiency of a power amplifier at a back-off point, a Doherty amplifier has recently received wide attention.

FIG. 1 is a block diagram illustrating the configuration of a conventional Doherty power amplifier.

Referring to FIG. 1, a Doherty amplifier 100 includes: a power divider 102; an input phase compensation unit 104; a carrier amplifier 106; a peaking amplifier 108; offset lines 110 and 112 configured to generate a high peaking output impedance when the peaking amplifier does not operate, and thus to allow the occurrence of a suitable load modulation phenomenon of the carrier amplifier; and a combiner 114.

The power divider 102 divides and outputs an input signal to the carrier amplifier 106 and the peaking amplifier 108. The carrier amplifier 106 uses relatively high input Direct Current (hereinafter, referred to as "DC") bias. The peaking amplifier 108 uses relatively low input DC bias. Each of the carrier amplifier 106 and peaking amplifier 108 amplifies the input signal according to a preset amplification gain and outputs the amplified input signal to the combiner 114. The combiner 114 combines the output signal of the carrier amplifier 110 and the output signal of the peaking amplifier 115. The input phase compensation unit 104 compensates for a phase difference which is caused by the offset lines 110 and 112 and the combiner 114.

FIG. 2a is a graph illustrating the fundamental current components of the carrier amplifier 106 and peaking amplifier 108 in ideal and real cases.

Referring to FIG. 2a, in the ideal case, it can be understood that the fundamental current components of the carrier amplifier 106 and peaking amplifier 108 have constant slopes according to the increase of an input voltage. However, in the real case, the carrier amplifier 106 and peaking amplifier 108 may be configured with a field effect transistor (FET), a high electron mobility transistor (HEMT), a bipolar junction transistor (BJT) or the like, which are semiconductor elements, wherein the current components of the FET, HEMT, and BJT increase in a square fashion or exponential fashion. When the current feature is applied to the peaking amplifier 108, the fundamental current components of the peaking amplifier 108 are the same as the real current feature in FIG. 2a.

FIG. 2b is a graph illustrating fundamental voltage components of the carrier amplifier 106 and peaking amplifier 108 in ideal and real cases.

Referring to FIG. 2b, it can be identified that the fundamental voltage components of the carrier amplifier 106 and peaking amplifier 108 in the real case are the same as in the ideal case. The fundamental voltage components are determined by the fundamental current components, the output matching impedance of the carrier amplifier 106 and the output matching impedance of the peaking amplifier 108, wherein the output matching impedances are as Equation 1 below:

$$Z_C = \begin{cases} \dfrac{Z_T^2}{Z_L} & 0 \leq V_{in} < 0.5 \cdot V_{in,Max} \\ \dfrac{Z_T^2}{Z_L \cdot \left[1 + \dfrac{I_P}{I_C'}\right]} & 0.5 \cdot V_{in,Max} \leq V_{in} \leq V_{in,Max} \end{cases} \quad (1)$$

$$Z_P = \begin{cases} \infty & 0 \leq V_{in} < 0.5 \cdot V_{in,Max} \\ Z_L \cdot \left[1 + \dfrac{I_C'}{I_P}\right] & 0.5 \cdot V_{in,Max} \leq V_{in} \leq V_{in,Max} \end{cases}$$

$$I_C' = I_C \cdot \dfrac{Z_T}{Z_L} - I_P.$$

In Equation 1, $V_{in}$ represents an input voltage, $Z_C$ represents the output matching impedance of the carrier amplifier 106, $Z_P$ represents the output matching impedance of the peaking amplifier 108, $Z_L$ represents a matching impedance at a point where the power of the carrier amplifier 106 and the power of the peaking amplifier 108 are combined, and $Z_T$ represents the characteristic impedance of the quarter wave transmission line between the carrier amplifier 106 and the peaking amplifier 108 in the combiner 114. Generally, there is a relation of $Z_L = Z_T/2$. In addition, $I_C$ represents input current of the carrier amplifier 106, and $I_P$ represents input current of the peaking amplifier 108.

Referring to Equation 1, it can be identified that, although the fundamental current components of the peaking amplifier 108 in the real case are less than those in the ideal case, the fundamental voltage components in the real case are the same as those in the ideal case, as shown in FIG. 2b, because the amplitudes of the $Z_C$ and $Z_P$ increase.

FIG. 3 is a graph illustrating the input/output power of the Doherty amplifier 100 in the ideal and real cases.

Referring to FIG. 3, in the ideal case, the Doherty amplifier 100 has a linear relation between the input and output power. However, in the real case, since the fundamental current components of the peaking amplifier 108 decrease as shown in FIG. 2a, the Doherty amplifier 100 has an output power lower that in the ideal case, so that the output power of the Doherty amplifier 100 including the peaking amplifier 108 cannot have a linear relation, and thus has an undesired distortion characteristic.

FIG. 4 is a graph illustrating a memory effect in a real Doherty amplifier.

The memory effect means that the distortion component of an amplifier is influenced by not only the current input signal, but also by previous input signals. The memory effect in an amplifier can be identified through a non-linearity measurement using a two-tone signal. When applying a two-tone signal to an amplifier, and observing the fundamental wave components of the amplifier and a third-order distortion signal with respect to the same output power, it is possible to identify third-order distortion signals having different amplitudes and different phases depending on the bandwidths of two-tone signals. Through such a method, it is possible to measure a memory effect. Generally, a large memory effect occurs in an intermediate output power, while a large memory effect is not observed in a low output power because a distortion component caused by the amplifier itself is small in the low output power. In addition, in a high output power, since the distortion component caused by the power amplifier itself is large, it is impossible to recognize a memory effect.

Referring to FIG. 4, it can be understood that the Doherty amplifier shows a memory effect characteristic different from that of a general amplifier. This is because the Doherty amplifier is configured with a carrier amplifier and a peaking amplifier, and the carrier amplifier and peaking amplifier operate differently from each other and thus show mutually different distortion characteristics.

As described above, not only the Doherty amplifier but also the other power amplifiers generate a non-linear component to distort an output signal, thereby degrading the signal quality. Therefore, in order to satisfy the linearity required in communication systems, it is necessary to develop a separate linearization technique. Among linearization techniques, a digital predistorter processes signals in a digital band, and thus has an excellent economical efficiency and expansion possibility, as compared with the other linearization techniques.

FIG. 5 is a block diagram illustrating the configuration of a Doherty amplification system including a digital predistorter, to which the present invention is applied.

Referring to FIG. 5, a Doherty amplification system includes a Doherty amplifier 100, a digital predistorter 200, a digital predistorter controller 300, a digital-to-analog converter (DAC) 400, an analog-to-digital converter (ADC) 500, an up converter 600, and a down converter 700.

The operation of the Doherty amplification system illustrated in FIG. 5 is as follows.

At an initial operation, the digital predistorter 200 enters an initial mode.

The initial mode means an operation mode for measuring the non-linear characteristic and memory effect of the Doherty amplifier 100. In the initial mode, it is possible to use either a specified signal which makes it possible to identify the characteristics of the Doherty amplifier 100 in the entire operation region thereof, or a signal used in a real communication system during a predetermined time period. Signals used in the initial mode will be inclusively designated as a test signal.

First, a digital signal, which is a test signal, is inputted to the digital predistorter 200 and the digital predistorter controller 300. However, in the initial mode, the signal inputted to the digital predistorter 200 passes through the digital predistorter 200 without any predistortion. The signal which has passed through the digital predistorter 200 is converted into an analog signal through the DAC 400. The analog signal which has passed through the DAC 400 is inputted to the up converter 600 and is thus converted into a high-frequency analog signal. The high-frequency analog signal is inputted to the Doherty amplifier 100 and is amplified therein. The analog signal which has been amplified by the Doherty amplifier 100 is distorted and thus has a non-linear characteristic and a memory effect. Most of the signal which has been amplified by the Doherty amplifier 100 propagates over the air, and a part thereof is converted into a low-frequency signal by the down converter 700. The low-frequency analog signal which has passed through the down converter 700 is converted into a digital signal through the ADC 500. The digital signal which has passed through the ADC 500 is inputted to the digital predistorter controller 300.

The digital predistorter controller 300 compares the test signal with a signal distorted by the Doherty amplifier 100, and perceives a non-linear characteristic and a memory effect which are caused by the Doherty amplifier 100. Using the perceived information, the digital predistorter controller 300 calculates a configuration value of the digital predistorter 200 in order to compensate for the non-linear characteristic and memory effect caused by the Doherty amplifier 100.

For reference, for convenience of description of the present invention, the non-linear characteristic represents an amplitude modulation-to-amplitude modulation (AM-to-AM) characteristic in which the amplitude of an output signal varies non-linearly depending on the amplitude of an input signal, and an amplitude modulation-to-phase modulation (AM-to-PM) characteristic in which the phase of an output signal varies non-linearly depending on the amplitude of an input signal. The digital predistorter 200 is configured with a look-up table (LUT), a polynomial, or the like.

Therefore, the digital predistorter controller 300 provides an LUT configuration value or a coefficient of a polynomial of the digital predistorter 200.

FIG. 6 is a block diagram illustrating the inner configuration of the conventional digital predistorter 200.

Referring to FIG. 6, the conventional digital predistorter is configured with an amplifier compensator 210.

The amplifier compensator 210 compensates for only the non-linear characteristic of the Doherty amplifier 100, or compensates for both non-linear characteristic and memory effect. In addition, a signal which has passed through the amplifier compensator 210 is inputted to the DAC 400 shown in FIG. 5.

The amplifier compensator 210 may be configured with a polynomial, may be configured with an LUT, and may be configured with both polynomial and LUT. In addition, Volterra Series, a reduction model of Volterra Series, a Wiener model, an expansion model of the Wiener model, a Hammerstein model, an expansion model of the Hammerstein, etc. may be applied to the amplifier compensator 210.

Generally, if an amplifier has a plurality of distortion generating sources to be linearized, and the respective distortion generating sources generate the same non-linear characteristic and memory effect, the non-linear characteristic and memory effect can be sufficiently compensated through the amplifier compensator 210 shown in FIG. 6.

However, in the case of an amplifier, such as a Doherty amplifier, which includes distortion generating sources generating mutually different non-linear characteristics and memory effects, there is a limitation in a degree of linearization improvement when linearization according to the conventional linearization manner is performed as in the amplifier compensator 210.

SUMMARY OF THE INVENTION

Accordingly, the present invention has been made in an effort to solve the problems occurring in the related art, and an object of the present invention is to provide a method and apparatus for effectively linearizing an amplifier which has a plurality of distortion generating sources.

In order to achieve the above object, according to one aspect of the present invention, there is provided an apparatus for effectively linearizing an amplifier having a plurality of distortion generating sources, the apparatus comprising: a plurality of digital predistortion compensators configured to compensate for the distortion characteristics of the respective distortion generating sources; a signal division unit configured to select one route of the plurality of digital predistorters according to the amplitude of an input signal; and a signal combination unit configured to combine predistorted signals which have passed through a plurality of digital predistorters, wherein the signal division unit selects and determines the route depending on the non-linear characteristic and memory effect of a distorted signal.

According to another aspect of the present invention, there is provided a method for effectively linearizing an amplifier having a plurality of distortion generating sources, the method comprising the steps of: Generating predistortion signals through a plurality of digital predistortion compensation steps for compensating for the distortion characteristics of the respective distortion generating sources; selecting one route of a plurality of digital predistorters according to the amplitude of an input signal; and combining predistorted signals which have passed through a plurality of digital predistorter, wherein, in a signal division step, the route is selected and determined depending on the non-linear characteristic and memory effect of a distorted signal.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Figure 1:
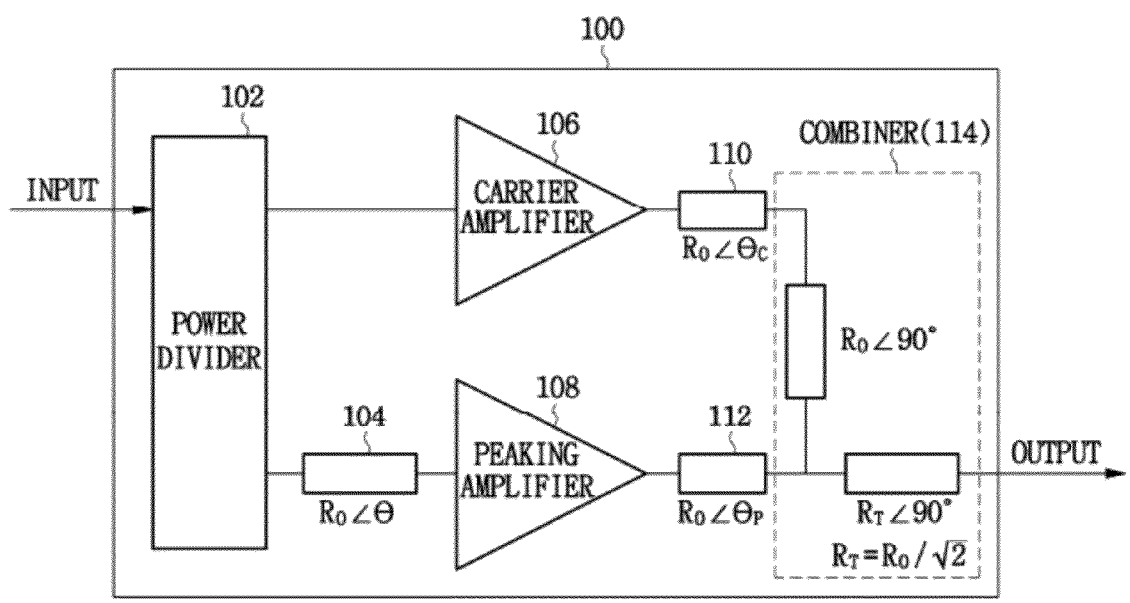
FIG. 1 is a block diagram illustrating the configuration of a conventional Doherty power amplifier.
Figure 2A:
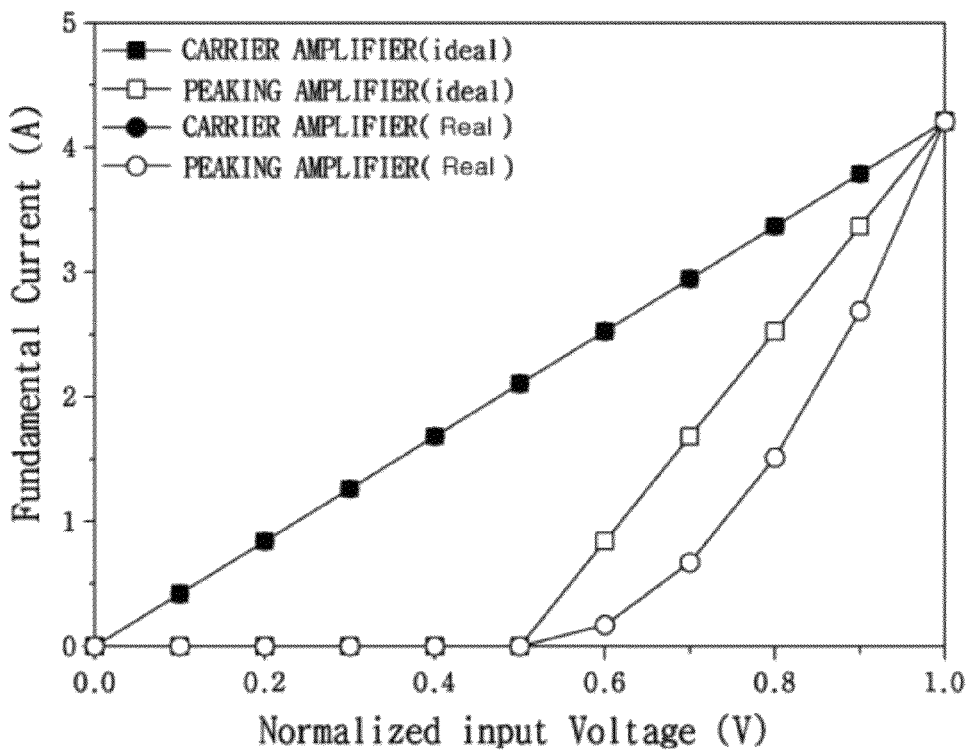
FIG. 2a is a graph illustrating the fundamental current components of a carrier amplifier and a peaking amplifier in ideal and real cases.
Figure 2B:
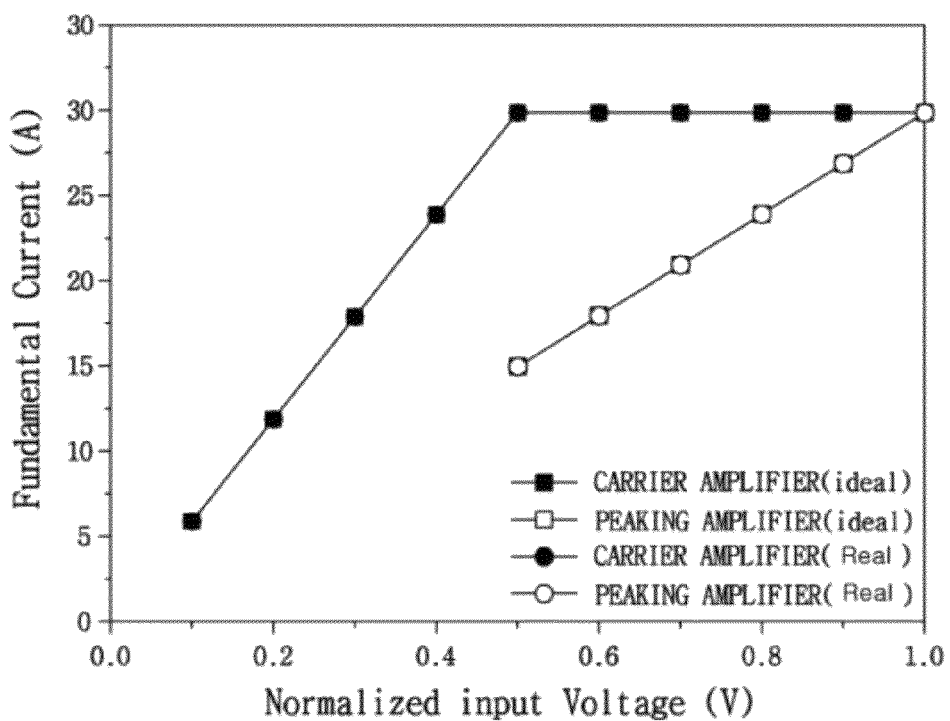
FIG. 2b is a graph illustrating the fundamental voltage components of the carrier amplifier and peaking amplifier in ideal and real cases.
Figure 3:
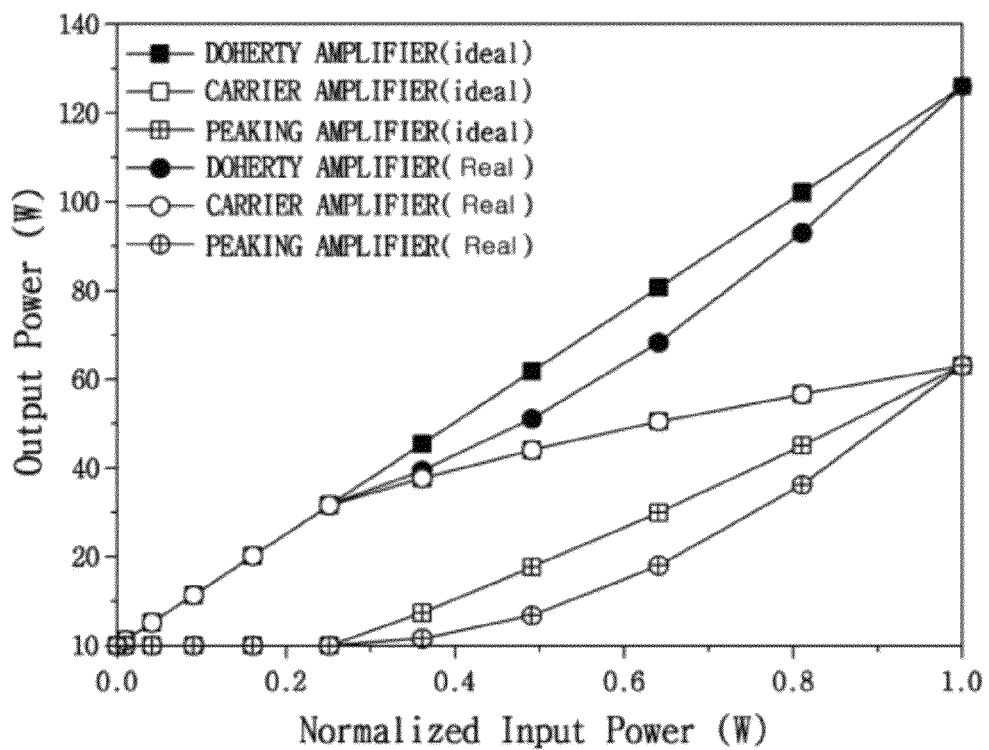
FIG. 3 is a graph illustrating the input/output power of a Doherty amplifier in the ideal and real cases.
Figure 4:
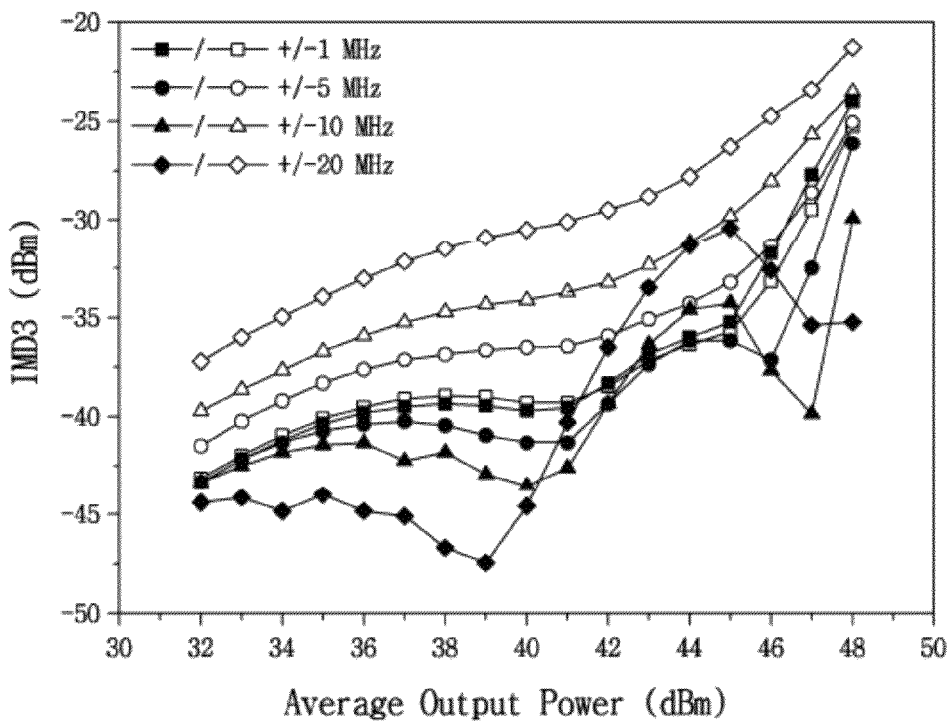
FIG. 4 is a graph illustrating a memory effect in a real Doherty amplifier.

Reference will now be made in greater detail to preferred embodiments of the invention, examples of which are illustrated in the accompanying drawings. Wherever possible, the same reference numerals will be used throughout the drawings and the description to refer to the same or like parts. In the following description of the present invention, a detailed description of known functions and configurations incorporated herein will be omitted when it may make the subject matter of the present invention rather unclear.

Before a detailed description of the present invention, it should be noted that a digital predistorter according to the present invention can be applied to compensate for mutually different non-linear characteristics and memory effects which are generated by a plurality of distortion generating sources during amplification through a plurality of amplifiers, wherein the following description will be given with a Doherty amplifier as an example.

Figure 7A:
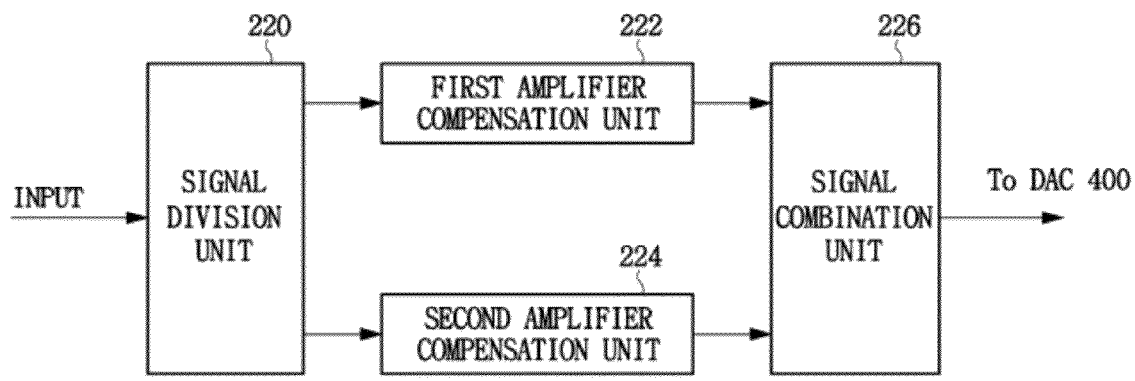
FIG. 7a is a block diagram illustrating the inner configuration of a digital predistorter according to a first embodiment of the present invention.

FIG. 7a is a block diagram illustrating the inner configuration of a digital predistorter according to a first embodiment of the present invention.

Referring to FIG. 7a, the digital predistorter includes a signal division unit 220, a first amplifier compensation unit 222, a second amplifier compensation unit 224, and a signal combination unit 226.

The signal division unit 220 compares the amplitude of an input signal with a predetermined threshold value, outputs the input signal to the first amplifier compensation unit 222 or the second amplifier compensation unit 224. That is to say, in the case where the amplitude of an input signal has a value in a range from 0 to 1, the signal division unit 220 outputs an input signal to the first amplifier compensation unit 222 when the input signal is in a range from 0 to the threshold value, and outputs an input signal to the second amplifier compensation unit 224 when the input signal is in a range from the threshold value to 1. Taking a Doherty amplifier for instance, the first amplifier corresponds to a carrier amplifier, and the second amplifier corresponds to a peaking amplifier. The threshold value is set to be the amplitude of an input signal which corresponds to a time point in which the peaking amplifier starts operating when the peaking amplifier ideally operates.

The first amplifier compensation unit 222 and the second amplifier compensation unit 224 output inverse distortion signals for compensating for the distortion components of amplifiers using the signal inputted from the signal division unit 220. In this case, the first amplifier compensation unit 222 and the second amplifier compensation unit 224 are in a state in which each compensation unit 222 and 224 has acquired a compensation value for compensating for not only the non-linear characteristic of a corresponding amplifier but also for an inverse distortion signal to compensate for the memory effect of the corresponding amplifier.

The first amplifier compensation unit 222 and the second amplifier compensation unit 224 may be configured with a polynomial, may be configured with an LUT, and may be configured with both polynomial and LUT. In addition, Volterra Series, a reduction model of Volterra Series, a Wiener model, an expansion model of the Wiener model, a Hammerstein model, an expansion model of the Hammerstein, etc. may be applied to the first amplifier compensation unit 222 and second amplifier compensation unit 224. In addition, it is obvious to a person skilled in the art to enable all types of compensation units capable of compensating for the non-linear characteristic and memory effect of an amplifier to be employed as the first amplifier compensation unit 222 and second amplifier compensation unit 224 according to the present invention.

Figure 5:
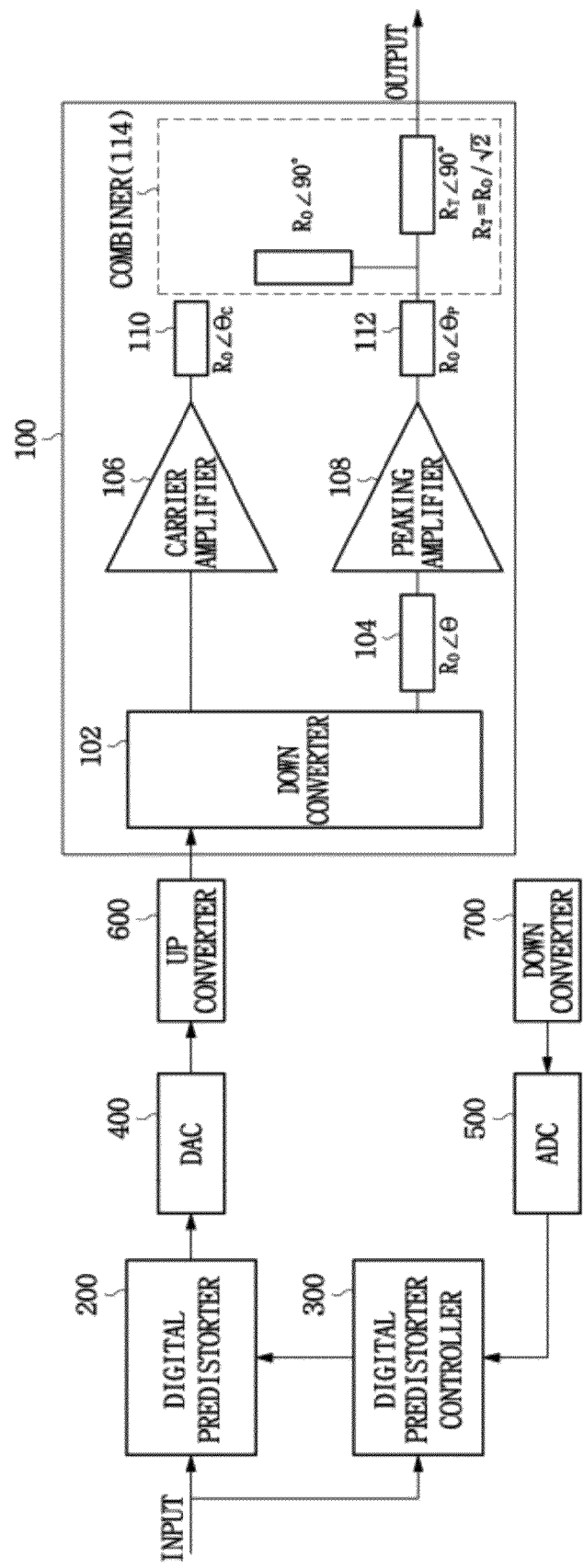
FIG. 5 is a block diagram illustrating the configuration of a Doherty amplification system including a digital predistorter, to which the present invention is applied.
Figure 6:
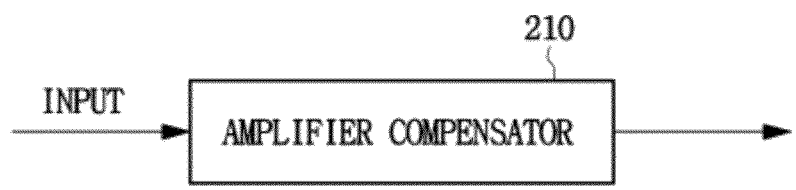
FIG. 6 is a block diagram illustrating the inner configuration of a conventional digital predistorter.

The signal combination unit 226 receives inverse distortion signals outputted from the first amplifier compensation unit 222 and second amplifier compensation unit 224, and sends an output signal to be used as an input of the DAC 400 shown in FIG. 5.

As described above, a compensation unit suitable for a distortion generating source making a large contribution to generation of a distortion signal according to the amplitudes of signals is used in an amplifier having a plurality of distortion generating sources, so that it is possible to effectively compensate for distortion signals generated by the distortion generating sources.

Figure 7B:
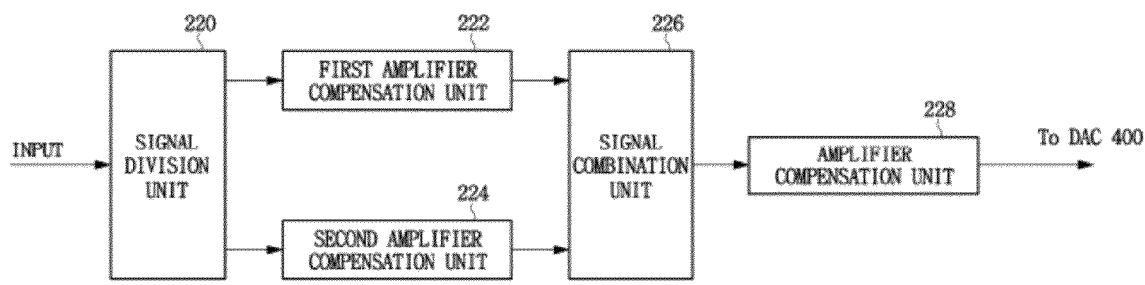
FIG. 7b is a block diagram illustrating the inner configuration of a digital predistorter according to a second embodiment of the present invention.

FIG. 7b is a block diagram illustrating the inner configuration of a digital predistorter according to a second embodiment of the present invention.

Referring to FIG. 7b, the digital predistorter includes a signal division unit 220, a first amplifier compensation unit 222, a second amplifier compensation unit 224, a signal combination unit 226, and an amplifier compensation unit 228.

The signal division unit 220, first amplifier compensation unit 222, second amplifier compensation unit 224, and signal combination unit 226 perform the same operations as those in FIG. 7a, so a detailed description thereof will be omitted.

The amplifier compensation unit 228 receives an inverse distortion signal, which has been created through the first amplifier compensation unit 222 and second amplifier compensation unit 224 and has been outputted from the signal combination unit 226, and then outputs an additional amplifier compensation signal.

The amplifier compensation unit 228 additionally compensates for interference between distortion signals generated by a plurality of distortion generating sources, or for discontinuity between inverse distortion signals created depending on a threshold value.

Similar to the case of first amplifier compensation unit 222 and second amplifier compensation unit 224, it is obvious to a person skilled in the art to enable all types of compensation units capable of compensating for the non-linear characteristic and memory effect of an amplifier to be employed as the amplifier compensation unit 228 according to the present invention.

Figure 7C:
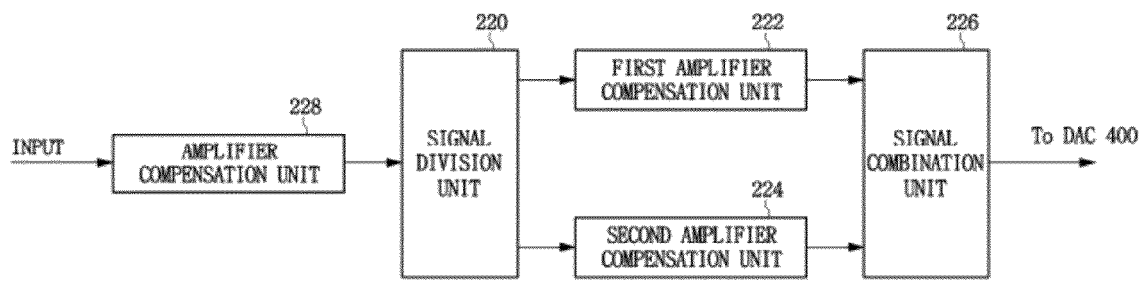
FIG. 7c is a block diagram illustrating the inner configuration of a digital predistorter according to a third embodiment of the present invention.

In addition, while the amplifier compensation unit 228 may be positioned after the signal combination unit 226, the amplifier compensation unit 228 may be positioned before the signal division unit 220, wherein the function of the amplifier compensation unit 228 is the same as that described above. Such a configuration is shown in FIG. 7c.

Figure 8A:
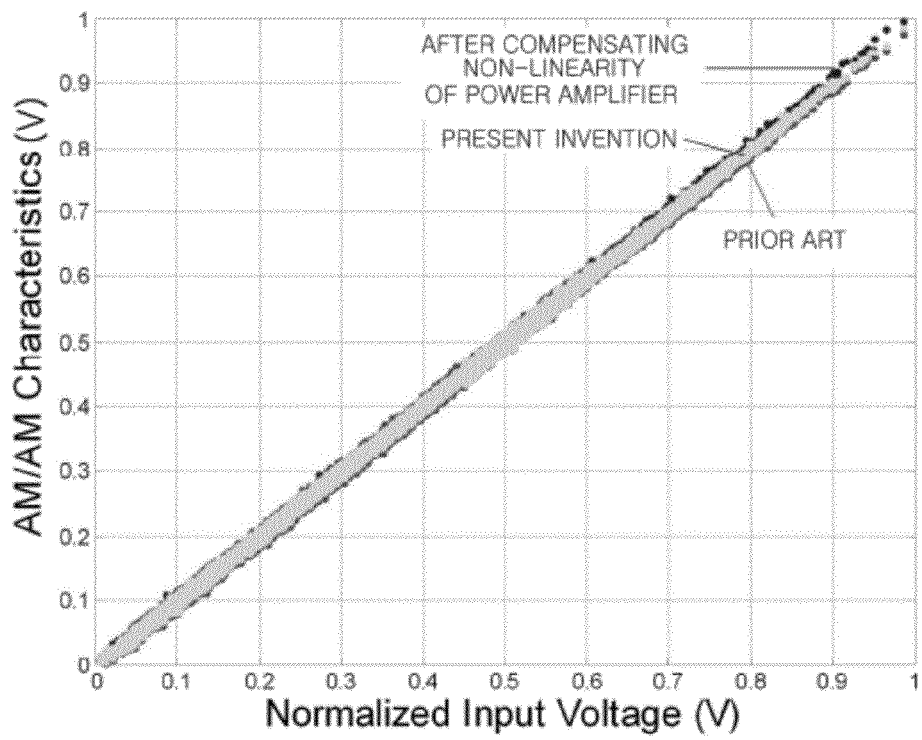
FIG. 8a is a graph illustrating an AM/AM characteristic modeling according to the present invention.
Figure 8B:
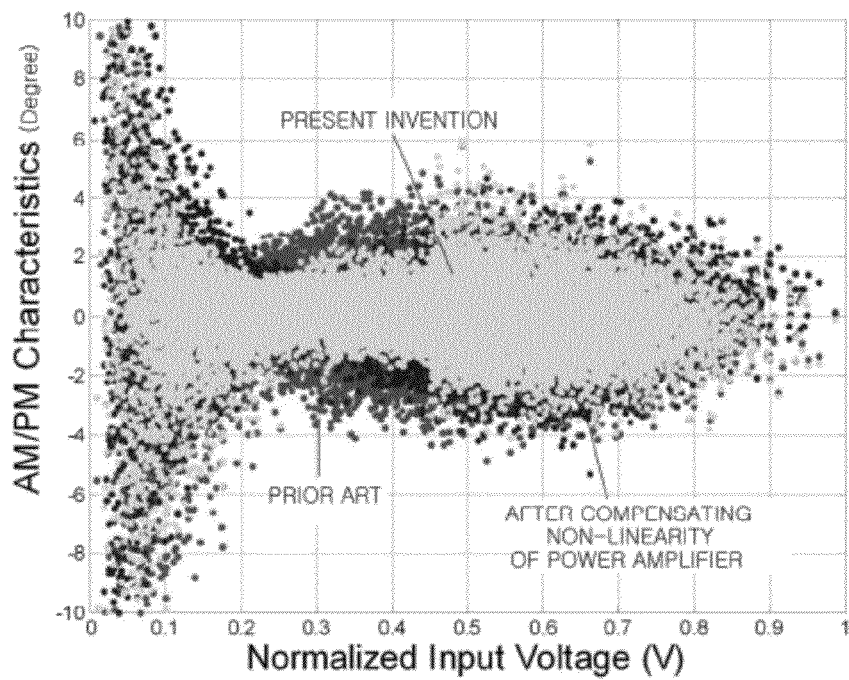
FIG. 8b is a graph illustrating an AM/PM characteristic modeling according to the present invention.

FIG. 8a is a graph illustrating an AM/AM characteristic modeling according to the present invention. FIG. 8b is a graph illustrating an AM/PM characteristic modeling according to the present invention.

Referring to FIGS. 8a and 8b, it can be understood that a model according to the present invention shows a superior performance characteristic to the conventional model.

Figure 9A:
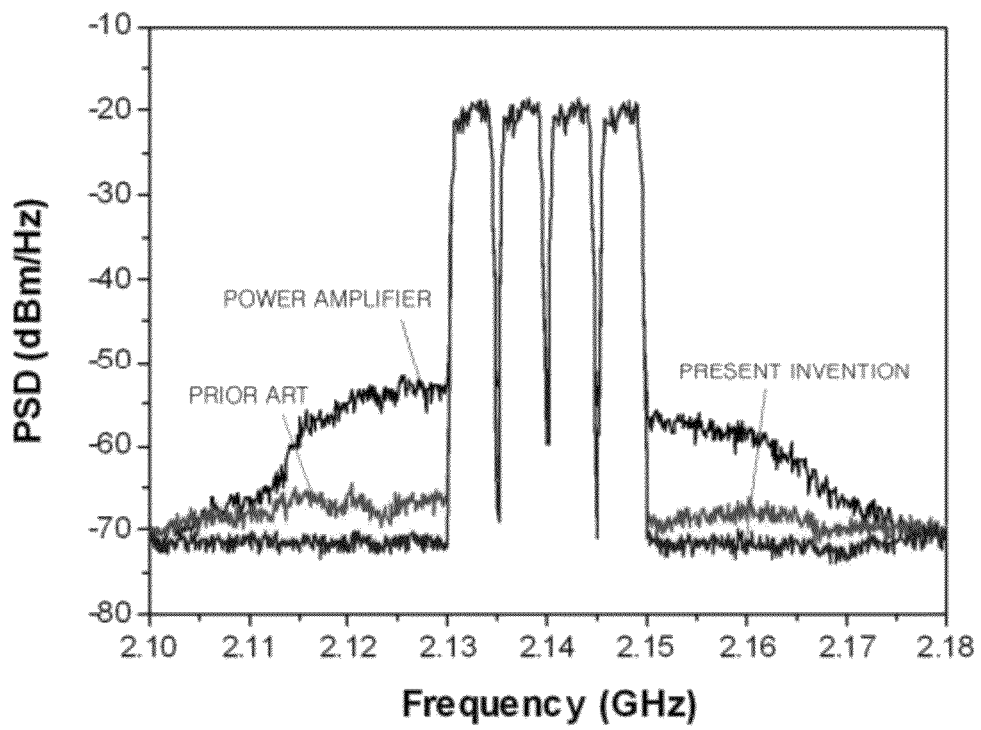
FIG. 9a is a graph illustrating a spectrum after power amplifier linearization according to the present invention.
Figure 9B:
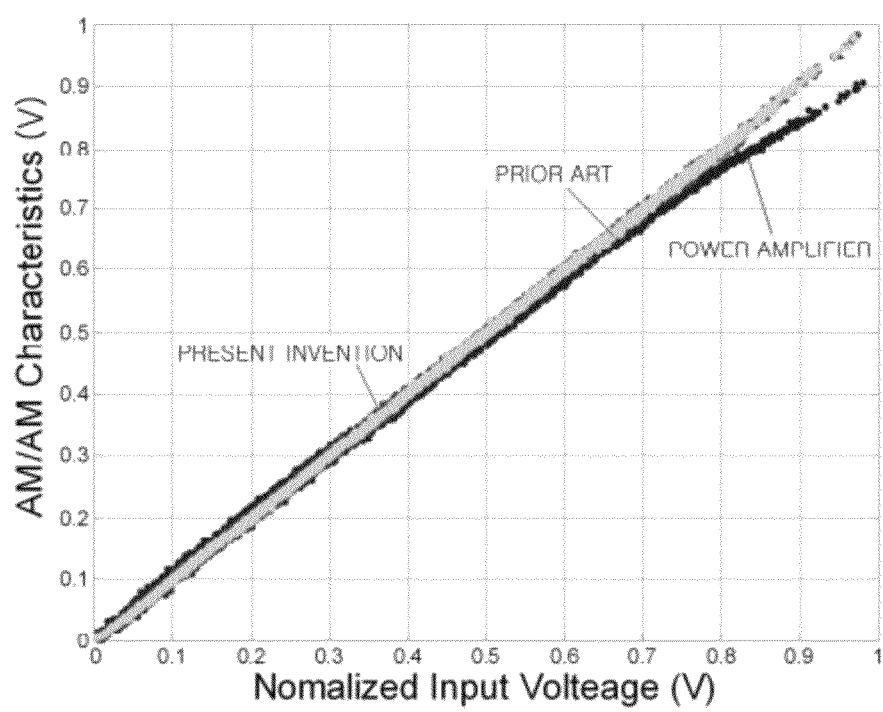
FIG. 9b is a graph illustrating an AM/AM characteristic after power amplifier linearization according to the present invention.
Figure 9C:
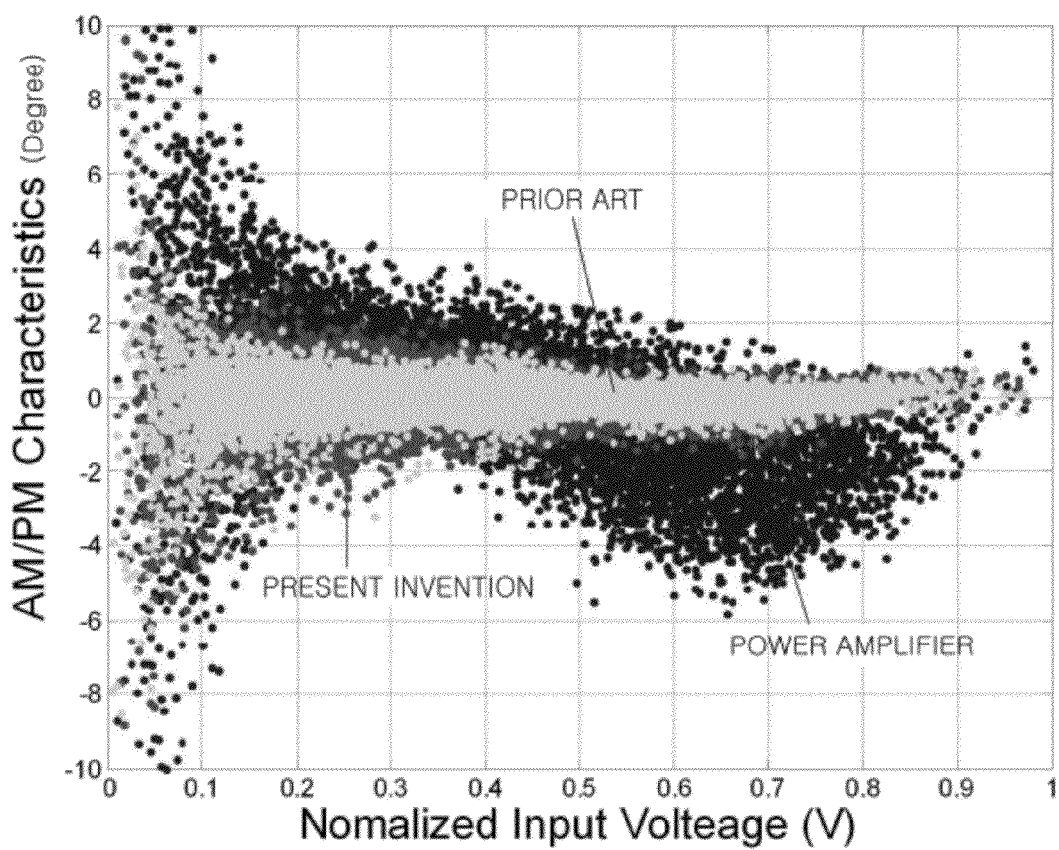
FIG. 9c is a graph illustrating an AM/PM characteristic after power amplifier linearization according to the present invention.

FIG. 9a is a graph illustrating a spectrum after power amplifier linearization according to the present invention. FIG. 9b is a graph illustrating an AM/AM characteristic after power amplifier linearization according to the present invention. FIG. 9c is a graph illustrating an AM/PM characteristic after power amplifier linearization according to the present invention.

Referring to FIGS. 9a to 9c, it can be understood that the linearization according to the present invention shows a superior performance characteristic in terms of the output of an amplifier to the conventional linearization.

As described above, it can be understood that a plurality of compensation units are used to compensate for the distortion characteristic of an amplifier which has a plurality of distortion generating sources, thereby obtaining a superior modeling characteristic, and thus outputting a superior linearization result.

As is apparent from the above description, the present invention provides a linearization apparatus, which includes a plurality of digital predistorters to compensate for the respective distortion characteristics generated by a plurality of distortion generating sources in order to compensate for mutually different non-linear characteristics and memory effects generated by the plurality of distortion generating sources, thereby making it possible to effectively compensate for the distortion signals generated by the plurality of distortion generating sources.

Although preferred embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A linearization apparatus for an amplifier having a plurality of distortion generating sources, the apparatus comprising:
a signal division unit configured to select a route of an input signal according to an amplitude of the input signal;
a plurality of compensation units; and
a signal combination unit configured to combine output signals of the plurality of compensation units,
wherein the signal division unit outputs the input signal to one of the plurality of compensation units through amplitude comparison between the amplitude of the input signal and a threshold value, and
wherein the plurality of compensation units individually compensate for distortion characteristics of the plurality of distortion generating sources in the amplifier.

2. The linearization apparatus according to claim 1, wherein the threshold value is set to be an amplitude value of an input signal at which a first amplifier in the amplifier starts operating.

3. The linearization apparatus according to claim 1, wherein the threshold value is set to be an amplitude value of an input signal which allows first and second amplifiers in the amplifier to be distinguished from each other with respect to mutually different distortion generation characteristics.

4. The linearization apparatus according to claim 1, wherein the plurality of compensation units are identical to the plurality of distortion generating sources of the amplifier in number.

5. The linearization apparatus according to claim 1, wherein the plurality of compensation units are different from the plurality of distortion generating sources of the amplifier in number.

6. The linearization apparatus according to claim 1, wherein the plurality of compensation units are located between the signal division unit and the signal combination unit.

7. The linearization apparatus according to claim 1, wherein one compensation unit of the plurality of compensation units is located before the signal division unit.

8. The linearization apparatus according to claim 1, wherein one compensation unit of the plurality of compensation units is located after the signal combination unit.

9. The linearization apparatus according to claim 1, wherein two compensation units of the plurality of compensation units are located before the signal division unit and after the signal combination unit, respectively.

10. A linearization method for an amplifier having a plurality of distortion generating sources, the method comprising:
 a signal division step of selecting a route of an input signal according to an amplitude of the input signal;
 a step of generating a plurality of compensation signals; and
 a step of combining the plurality of compensation signals,
 wherein, in the signal division step, the input signal is outputted to a one-compensation-signal generating step of the step of generating the plurality of compensation signals through amplitude comparison between the amplitude of the input signal and a threshold value, and
 wherein, in the step of generating the plurality of compensation signals, the compensation signals are individually generated for distortion characteristics of the plurality of distortion generating sources in the amplifier.

11. The linearization method according to claim 10, wherein the threshold value is set to be an amplitude value of an input signal at which a first amplifier in the amplifier starts operating.

12. The linearization method according to claim 10, wherein the threshold value is set to be an amplitude value of an input signal which allows first and second amplifiers in the amplifier to be distinguished from each other with respect to mutually different distortion generation characteristics.

13. The linearization method according to claim 10, wherein, in the step of generating the plurality of compensation signals, the plurality of compensation signals are identical to the plurality of distortion generating sources of the amplifier in number.

14. The linearization method according to claim 10, wherein, in the step of generating the plurality of compensation signals, the plurality of compensation signals are different from the plurality of distortion generating sources of the amplifier in number.

15. The linearization method according to claim 10, wherein the step of generating the plurality of compensation signals is performed between the signal division step and the signal combination step.

16. The linearization method according to claim 10, wherein one compensation signal generation step of the step of generating the plurality of compensation signals is performed before the signal division step.

17. The linearization method according to claim 10, wherein one compensation signal generation step of the step of generating the plurality of compensation signals is performed after the signal combination step.

18. The linearization method according to claim 10, wherein two compensation signal generation steps of the step of generating the plurality of compensation signals are performed before the signal division step and after the signal combination step, respectively.

* * * * *